(12) United States Patent
Aasheim et al.

(10) Patent No.: US 7,844,878 B2
(45) Date of Patent: Nov. 30, 2010

(54) DYNAMIC ELECTRONIC CORRECTION CODE FEEDBACK TO EXTEND MEMORY DEVICE LIFETIME

(75) Inventors: Jered D. Aasheim, Bellevue, WA (US); Pranish Kumar, Kirkland, WA (US)

(73) Assignee: Microsoft Corporation, Redmond, WA (US)

( * ) Notice: Subject to any disclaimer, the term of this patent is extended or adjusted under 35 U.S.C. 154(b) by 1148 days.

(21) Appl. No.: 11/502,120

(22) Filed: Aug. 9, 2006

(65) Prior Publication Data

US 2008/0052599 A1  Feb. 28, 2008

(51) Int. Cl.
G11C 29/00 (2006.01)
(52) U.S. Cl. .................. 714/763; 714/777
(58) Field of Classification Search .......... 714/763, 714/777
See application file for complete search history.

(56) References Cited

U.S. PATENT DOCUMENTS

| | | | | |
|---|---|---|---|---|
| 5,490,149 | A | 2/1996 | Nylander-Hill | 395/182.03 |
| 5,754,753 | A * | 5/1998 | Smelser | 714/8 |
| 7,171,607 | B2 * | 1/2007 | Tsunoda | 714/765 |
| 2003/0056141 | A1 | 3/2003 | Lai et al. | 714/6 |
| 2003/0163632 | A1 | 8/2003 | Aasheim et al. | 711/103 |
| 2004/0153902 | A1 | 8/2004 | Machado et al. | 714/710 |
| 2005/0114589 | A1 | 5/2005 | Lofgren et al. | 711/103 |
| 2005/0132125 | A1 | 6/2005 | Gan et al. | 711/103 |
| 2005/0235097 | A1 | 10/2005 | Liang et al. | 711/103 |
| 2006/0036897 | A1 | 2/2006 | Lin et al. | 714/5 |

FOREIGN PATENT DOCUMENTS

WO  WO 2006/013529  2/2006

OTHER PUBLICATIONS

Accurately judging endurance for solid-state storage; http://www.edn.com/article/CA6298274.html, 6 pgs.
msystems(™) Expands Offering with Introduction of Industrial Grade CompactFlash($^R$); With Densities Ranging from 32 MB to 8GB, Added Ruggedness, Reliability and Security, msystems Makes CompactFlash Sm; http://news.moneycentral.msn.com/ticker/article.asp?Feed=BW&Date=20060403&ID=5614802&Symbol=US:FLSH, 4 pgs.
USB Pen Driver; http://www.wing-span.com.tw/usb11/pu-101.htm, 1 pg.
Flash management: How it extends the lifetime of solid-state Flash disks in VMEbus-based systems; http://www.vmebus-systems.com/pdf/MSystems.Aug05.pdf, 4 pgs.

* cited by examiner

Primary Examiner—Guy J Lamarre
(74) Attorney, Agent, or Firm—Merchant & Gould, P.C.

(57) ABSTRACT

Unrecoverable electronic correction code (ECC) errors in memory storage devices are usually preceded by recoverable ECC errors. A memory storage device controller is provided notice of the recoverable errors and associated information. The memory storage device controller can cause the data having the recoverable information to be rewritten on the memory storage device. Rewriting the data on the memory storage device (often in a different location) normally reduces the probability of encountering data with unrecoverable data errors.

20 Claims, 4 Drawing Sheets

DYNAMIC ELECTRONIC CORRECTION CODE FEEDBACK TO EXTEND MEMORY DEVICE LIFETIME

BACKGROUND

Flash memories are a type of non-volatile memory used by electronic devices. Flash media suffers from a variety of electrically limiting characteristics that limit the useful lifetime of a flash media device. One such characteristic is limited data retention and charge leakage, which can result in (unintentional) changes of logic "1" bits (that are represented by a presence of a charge, for example) to logic "0" bits (that are represented by a relative lack of charge, for example). Another such characteristic is the relatively limited number of erasures for a block of flash that can be performed before the block can no longer be reliably erased and reprogrammed.

Error Detection and Correction Codes can be used to detect and, to a limited extent, correct errors in words that are stored in electronic memories. For example, extra bit cells in a flash memory device can be provided for each stored word. A 2-bit detection/1-bit correction Hamming code can be stored in the extra bit cells to allow detection of up to a 2-bit error in a stored word, and correction of a 1-bit error in a stored word. Thus, in this example, a 1-bit error in a word can be corrected using the Hamming code, whereas a 2-bit error in a word can be detected, but not (reliably) corrected. In typical usage the occurrence of a 1-bit error precedes that of a 2-bit error.

Block management can be used to track the number of erasures for a block (that are used before writing data to the block). The number of erasures can be used to provide "wear-leveling," where blocks to be erased are cycled such that all available blocks in the flash memory devices are approximately erased the same number of times. (Extra blocks of memory can be used to replace blocks that exceed their number of allowable erasures.)

Block management is also used to mark a block as being "bad" when the block becomes invalid and can no longer be reliably used. Bad blocks may occur at anytime during the lifetime of the part, and once a block goes bad it is usually considered to be always bad. Accordingly, the use of bad blocks is avoided, and the Flash Abstraction Layer accounts for these blocks.

SUMMARY

This summary is provided to introduce a selection of concepts in a simplified form that are further described below in the detailed description. This summary is not intended to identify key features or essential features of the claimed subject matter, nor is it intended as an aid in determining the scope of the claimed subject matter.

The present disclosure is directed to providing dynamic error correction feedback to flash management logic for extending the lifetime of flash media. The flash management can be implemented as a Flash Abstraction Layer (FAL) provided by an operating system that makes calls to (typically) "low-level" functionality provided by Flash Media Device (FMD), for example. The FMD can report a 1-bit error in a stored word in flash device to the FAL. The 1-bit error can normally be corrected using electronic correction codes. The FAL can mark this block as the next block for "compaction," so that data associated with the block from which the 1-bit error was reported would be rewritten to another block on the media (and the offending block erased).

Because the originally "failing" block is erased, electrical charge is restored back to all the bit cells in the marked block, which clears the 1-bit ECC (Electronic Correction Code) error from the system. Clearing the 1-bit ECC error code from the block resets the number of READ operations that can occur to this page before another 1-bit error would occur. In other words, by dynamically supplying the wear-leveler algorithm with bit-error information, the probability of 2-bit ECC errors occurring is significantly reduced and the useful lifetime of the flash without data loss or incident(s) of corruption is significantly lengthened.

These and other features and advantages will be apparent from a reading of the following detailed description and a review of the associated drawings. It is to be understood that both the foregoing general description and the following detailed description are explanatory only and are not restrictive. Among other things, the various embodiments described herein may be embodied as methods, devices, or a combination thereof. Likewise, the various embodiments may take the form of an entirely hardware embodiment, an entirely software embodiment or an embodiment combining software and hardware aspects. Furthermore, various operating systems and drivers can be used to provide a system providing dynamic feedback flash management. Likewise, any memory storage device that uses stored charge (which is typically subject to leakage) can benefit from this disclosure. The disclosure herein is, therefore, not to be taken in a limiting sense.

DETAILED DESCRIPTION

Figure 1:
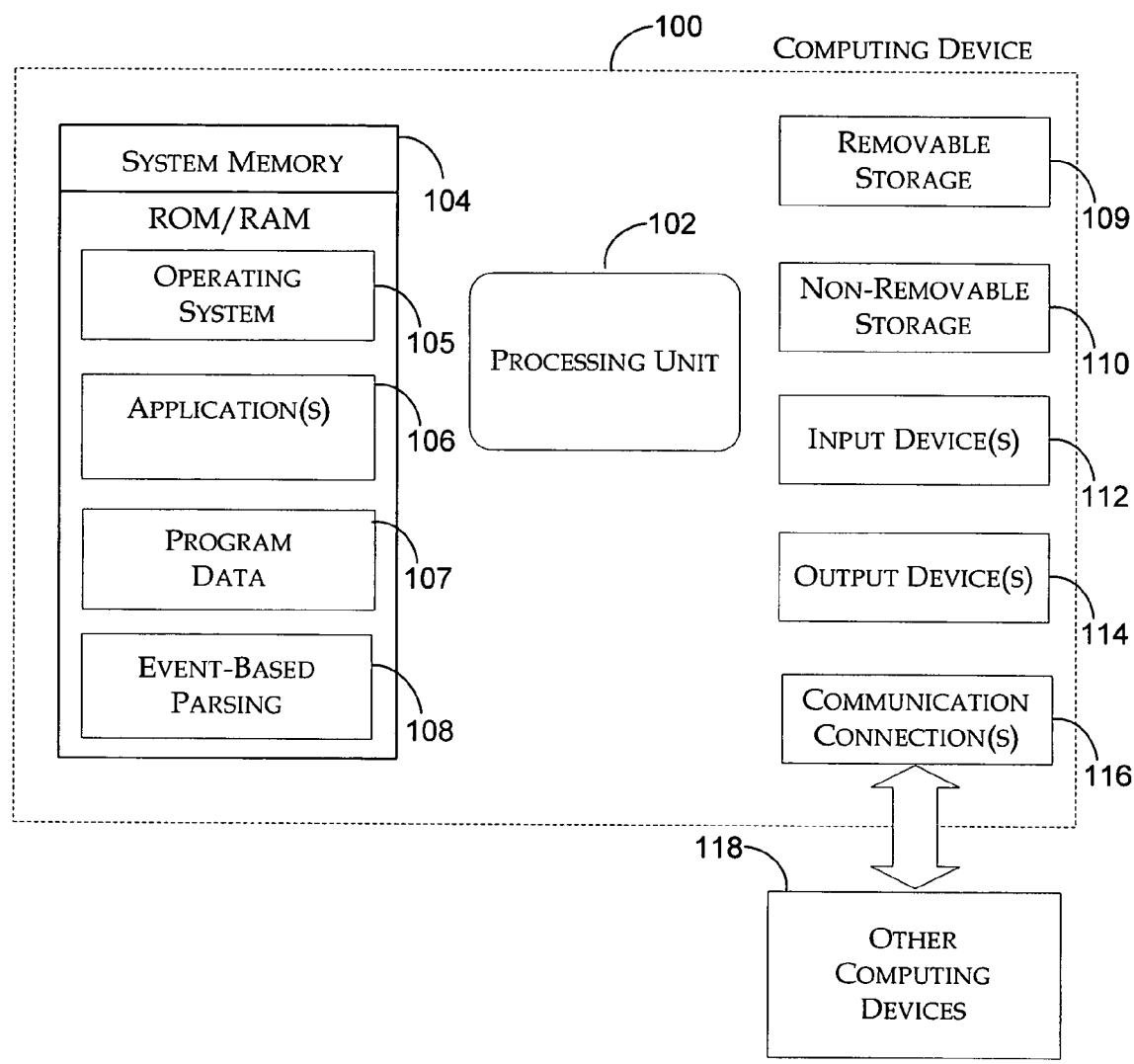
FIG. 1 is an illustration of an example operating environment and system for providing dynamic error correction for flash devices.

As briefly described above, embodiments are directed to providing dynamic error correction feedback to flash management logic. With reference to FIG. 1, one example system for implementing providing dynamic error correction for flash devices includes a computing device, such as computing device 100. Computing device 100 may be configured as a client, a server, a mobile device, or any other computing device that interacts with data in a network based collaboration system. In a very basic configuration, computing device 100 typically includes at least one processing unit 102 and system memory 104. Depending on the exact configuration and type of computing device, system memory 104 may be volatile (such as RAM), non-volatile (such as ROM, flash memory, etc.) or some combination of the two. System memory 104 typically includes an operating system 105, one or more applications 106, and may include program data 107. Dynamic feedback of correction errors in flash memory (described below with reference to FIGS. 2-4) can be implemented using system memory 104.

Computing device 100 may have additional features or functionality. For example, computing device 100 may also include additional data storage devices (removable and/or non-removable) such as, for example, magnetic disks, optical disks, or tape. Such additional storage is illustrated in FIG. 1 by removable storage 109 and non-removable storage 110. Computer storage media may include volatile and nonvolatile, removable and non-removable media implemented in any method or technology for storage of information, such as computer readable instructions, data structures, program modules, or other data. System memory 104, removable storage 109 and non-removable storage 110 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing device 100. Any such computer storage media may be part of device 100. Computing device 100 may also have input device(s) 112 such as keyboard, mouse, pen, voice input device, touch input device, etc. Output device(s) 114 such as a display, speakers, printer, etc. may also be included.

Computing device 100 also contains communication connections 116 that allow the device to communicate with other computing devices 118, such as over a network. Networks include local area networks and wide area networks, as well as other large scale networks including, but not limited to, intranets and extranets. Communication connection 116 is one example of communication media. Communication media may typically be embodied by computer readable instructions, data structures, program modules, or other data in a modulated data signal, such as a carrier wave or other transport mechanism, and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. The term computer readable media as used herein includes both storage media and communication media.

Figure 2:
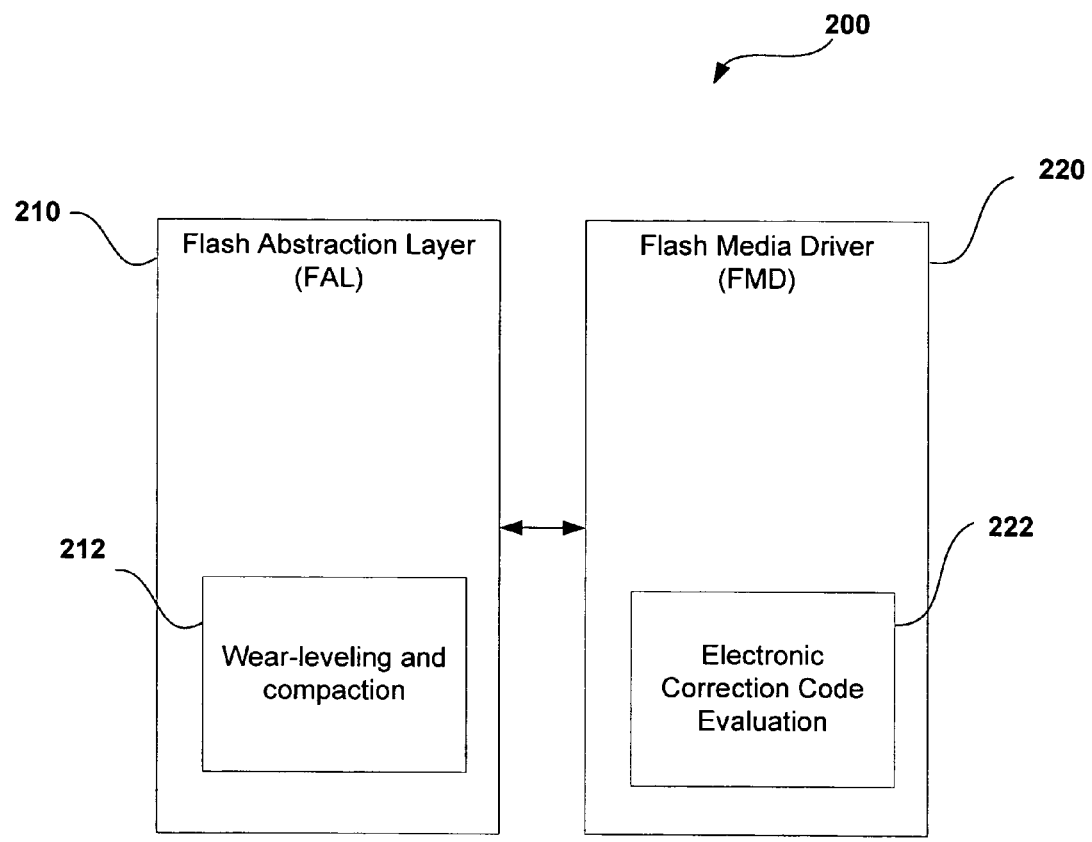
FIG. 2 is a top-level illustration of a memory system for providing dynamic feedback for a flash memory driver.

FIG. 2 is a top-level illustration of a memory system for providing dynamic feedback for a flash memory driver. As shown in the figure, a driver 200 is partitioned into a Flash Abstraction Layer (FAL) 210 and a Flash Media Driver (FMD) 220. In one embodiment, the FAL 210 is provided by an operating system and the FMD 220 is code written for a specific flash device. The specific code can, in some embodiments, be stored on the flash device itself.

FAL 210 comprises wear-leveler 212. Wear-leveler 212 is used to (approximately) evenly distribute block erasures to enhance the reliability and extend the reliability of the flash memory. Block erasures are performed when rewriting data to the flash memory. To minimize the number of writes required and to serialize data (especially for NAND-type flash memory), compaction of data can be performed and the data written to areas of the flash memory that have typically been less-used.

FMD 220 comprises ECC logic 222. ECC logic 222 can be implemented by using a 2-bit detection/1-bit correction Hamming Code per block of flash data (where a block can be 512 bytes, for example). ECC logic 222 can handle data-corruption issues, and also provides a feedback mechanism into the upper-layer flash management software (specifically the wear-leveler) for when ECC issues are encountered.

FAL 210 uses 1-bit error detection from ECC logic 222 to make intelligent decisions on which blocks to compact next while wear-leveling the block erasures across the device. In this way, compacting blocks that produce 1-bit ECC errors can dramatically extend the data integrity lifetime of the flash memory. Moving the data from a block that produces one or more 1-bit errors to a "fresh" block in the flash memory typically resets the clock for when a potentially catastrophic 2-bit ECC error would occur to this data, which results in data loss.

In operation, the FMD 220 reads a block and encounters a 1-bit ECC error which it detects by reading Hamming code bits that are associated with the read data. The FMD 220 corrects the erroneous bit on the buffer that holds the read data. After correcting the erroneous bit, the FMD 220 calls back into the FAL to indicate that a 1-bit ECC error has occurred in a particular block address.

The FAL 210 then uses this 1-bit ECC error information to control the wear-leveling algorithm of wear-leveler 212. When the FAL 210 marks this block as the next block for compaction, the buffered information is rewritten to another block on the media (and offending block erased). Accordingly, the buffered information is rewritten to other bit-cells on the flash memory device.

Because the originally "failing" block is erased, electrical charge is restored back to all the bit cells in the marked block, which clears the 1-bit ECC error from the system. Clearing the 1-bit ECC error code from the block resets the number of READ operations that can occur to this page before another 1-bit error would occur. In other words, by dynamically supplying the wear-leveler algorithm with bit-error information, the probability of 2-bit ECC errors occurring is significantly reduced and the useful lifetime of the flash without data loss is significantly lengthened.

The algorithm for wear-leveling in FAL 210 uses "bad" block information, the number of erase cycles for each block, and detected ECC errors. Thus, the bit errors are not only recoverable, but also used to significantly reduce the probability of unrecoverable (i.e., detected, but not correctable) ECC errors from occurring in the system.

Figure 3:
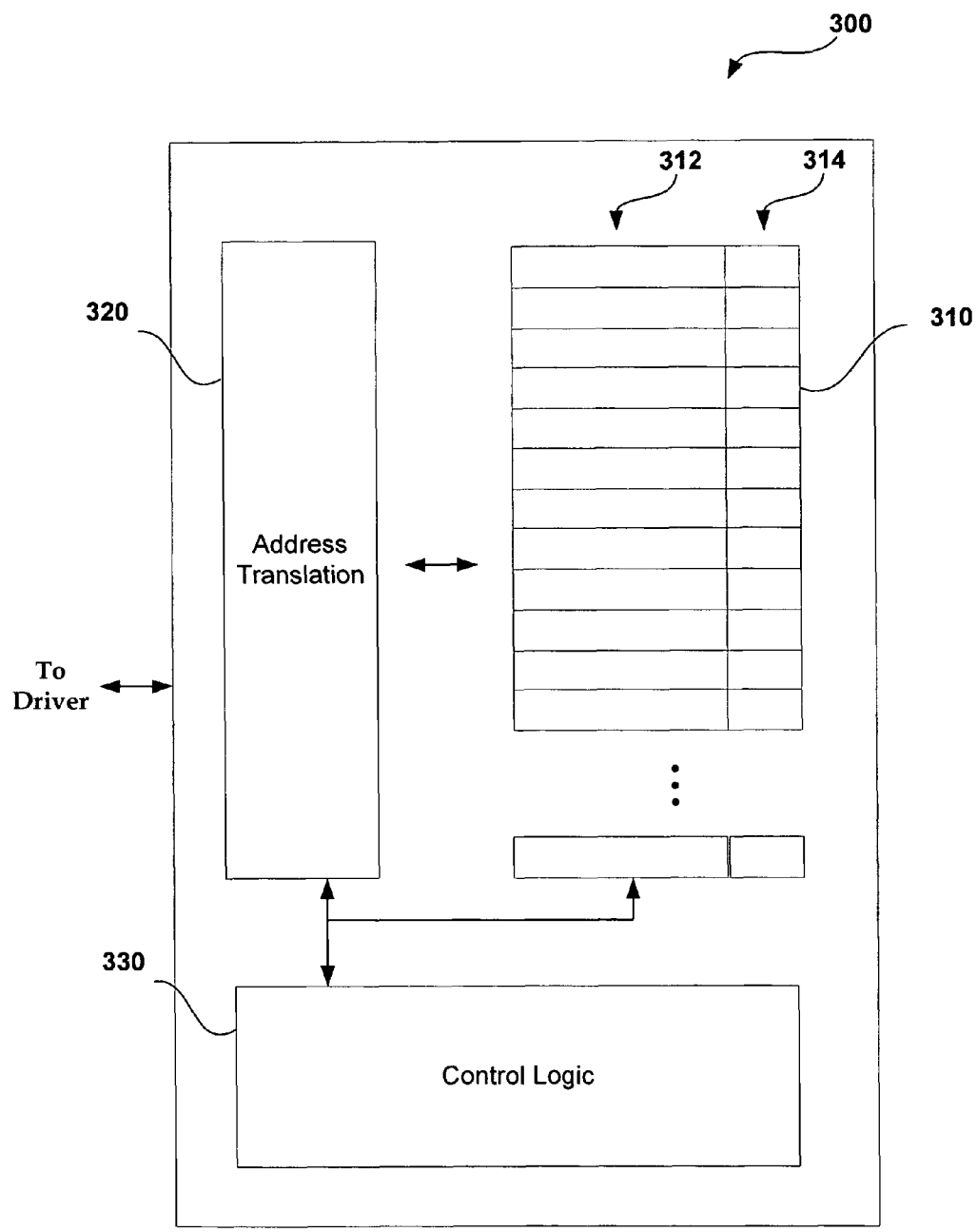
FIG. 3 is an illustration of an architectural view of a flash memory device.

FIG. 3 is an illustration of an architectural view of a flash memory device. Flash memory 300 comprises a bit array 310, an address translation buffer 320, and control logic 330. Bit array 310 comprises block 312 for storing data, and error correction code 314 for detecting and correcting errors of data stored within bit array 310. In an alternate embodiment, the error correction codes 314 can be stored within FMD 220. Address translation buffer 320 is arranged to translate an incoming address for data to a physical block address.

Flash memories (which rely upon stored charge for data retention) are subject to both leakage and a limited number of write/erase cycles. Address translation allows for wear-leveling to be implemented such that the same logical address can be used to access data that will be physically stored in separate locations Control logic 330 is arranged to program addresses within the address translation buffer 320 to store and retrieve data within bit array 310.

Flash memory 300 is a memory storage device that uses stored charge for storing data. Bit-cells of the flash memory 300 can be implemented using NAND and/or NOR technologies. NOR-based bit-cells can be used for storing data that changes infrequently (such as code), and NAND-based bit-cells can be used for storing and accessing sequential data quickly. Although flash memory 300 has been disclosed as an embodiment, dynamic error detection feedback can be used for any rewriteable memory storage device that is subject to leakage or gradual data loss.

Figure 4:
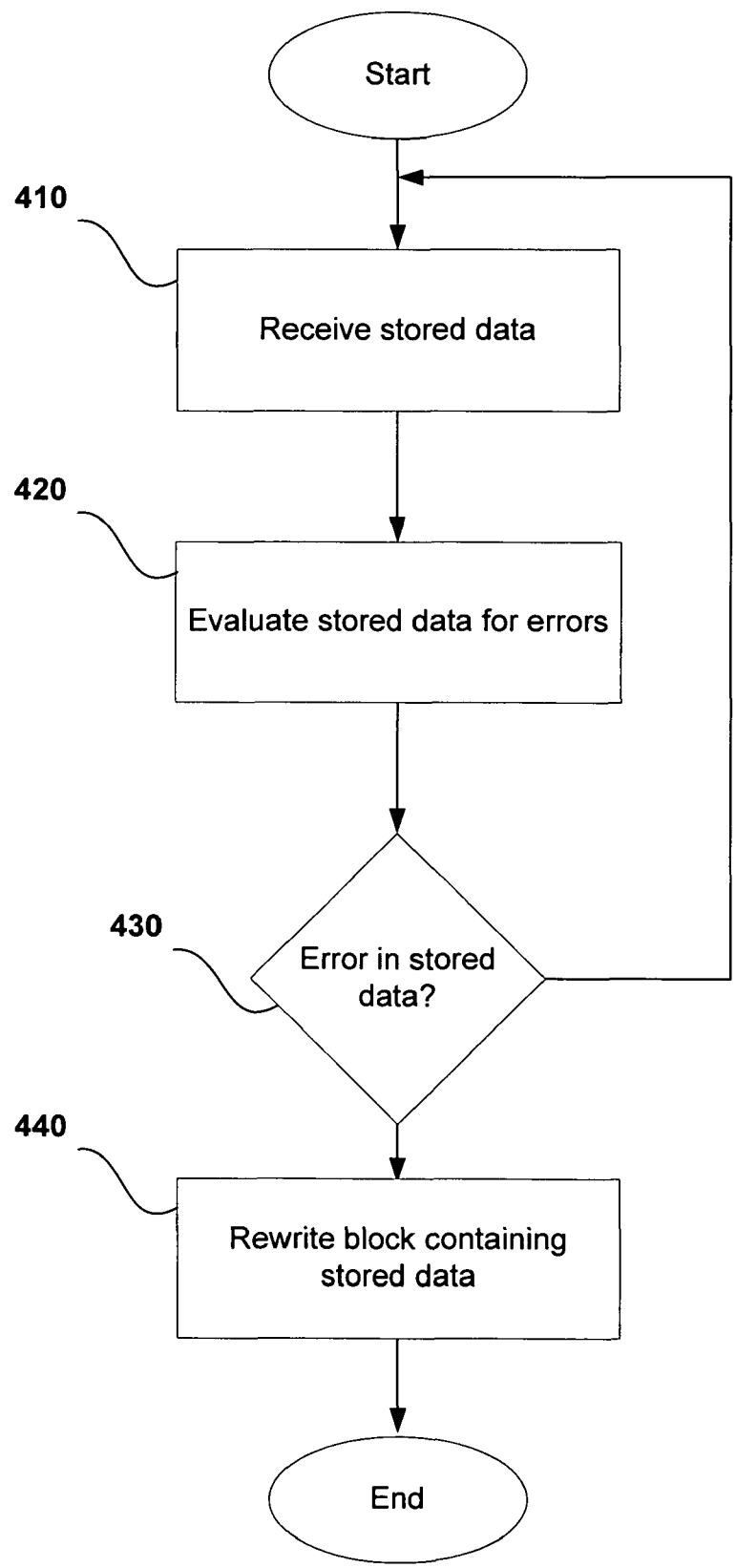
FIG. 4 is a flow graph of a process for providing dynamic error correction for flash devices.

FIG. 4 is an illustration of a flow graph diagram for providing dynamic feedback for a flash memory driver. In operation 410, stored data from a block of a memory device is received by a memory device driver. The memory can be flash memory, for example. The stored data is usually stored with correction codes for detecting recoverable errors (where data can usually be restored) and unrecoverable errors in the stored data.

In operation 420, the stored data received from the memory device is evaluated using a correction code that is associated with the received stored data. The correction code can be a 2-bit detection/1-bit correction Hamming code for unrecoverable and recoverable errors, respectively.

In operation 430, notifications of errors are typically given, and the data corrected if possible. When a recoverable error is detected, the driver can use an API to notify an operation system routine for compacting blocks in the memory device, for example. Other embodiments can "hard code" the routines, such that dynamic links between the calls do not need to be established at run-time. Use of an API allows operating system-level code to be written that does not need to be aware of device specific characteristics, such as numbers of write cycles (or duration thereof) for erasing a particular memory device.

In operation 440, commands are given to rewrite the data associated with the error to the memory device. The rewritten block can be rewritten to the same physical location of the memory device or a different physical location on the memory device. The block can be rewritten as part of a wear-leveling process, which typically extends the lifetime of a memory device by rewriting data in different physical locations in successive erase and write cycles. The wear-leveling process can be used with a compaction routine, which rewrites data (and reclaims unused memory space, for example) to make the data more easily accessible. Rewriting the data when a recoverable error occurs in the memory device, typically increases the length of time before either a recoverable or an unrecoverable error would be expected to occur.

The above specification, examples and data provide a complete description of the manufacture and use of embodiments of the invention. Since many embodiments of the invention can be made without departing from the spirit and scope of the invention, the invention resides in the claims hereinafter appended.

We claim:

1. A computer-implemented method for controlling a first memory device, comprising:
    receiving stored data from a block at a first location of the first memory device; wherein the first memory device comprises a plurality of blocks;
    evaluating the received stored data with a correction code that is associated with the received stored data; and
    when a recoverable error is detected in the received stored data, correcting the received stored data, generating a request for rewriting the block comprising the corrected received stored data at a second location in another block of the first memory and erasing the block at the first location.

2. The method of claim 1 wherein the correction code is stored on the first memory device.

3. The method of claim 1 wherein the correction code is stored on a second memory device.

4. The method of claim 1 wherein the correction code is a Hamming code.

5. The method of claim 1 wherein the received commands are arranged to compact data on the first memory device.

6. The method of claim 1 wherein the first memory device is a flash memory.

7. The method of claim 1 wherein the first memory device is a flash memory comprising NAND-type bit-cells.

8. The method of claim 1 wherein the received commands are received from an operating system level process via an application programmers interface.

9. The method of claim 1 wherein the commands to rewrite the block cause selected bit-cells in the block to be charged to the level of a logic "1".

10. The method of claim 1 wherein the commands to rewrite the block comprise supplying the first memory device with an address to be used for address translation.

11. A computer-readable storage medium having computer-executable instructions encoded thereon for controlling a first memory device, comprising:
    receiving stored data from a block at a first location of the first memory device; wherein the first memory device comprises a plurality of blocks;
    evaluating the received stored data with a correction code that is associated with the received stored data; and
    when a recoverable error is detected in the received stored data, correcting the received stored data, generating a request for rewriting the block comprising the corrected received stored data at a second location in another block of the first memory and erasing the block at the first location.

12. The computer-readable storage medium of claim 11 wherein the correction code is a Hamming code.

13. The computer-readable storage medium of claim 11 wherein the received commands are arranged to compact data on the first memory device.

14. The computer-readable storage medium of claim 11 wherein the first memory device is a flash memory.

15. The computer-readable storage medium of claim 11 wherein the commands to rewrite the block comprise supplying the first memory device with an address to be used for address translation.

16. A system for controlling a first memory device, comprising:
    a processor, a first memory device, and an operating system, the operating system configured to perform actions comprising:
    receiving stored data from a block at a first location of the first memory device; wherein the first memory device comprises a plurality of blocks;
    evaluating the received stored data with a correction code that is associated with the received stored data; and
    when a recoverable error is detected in the received stored data, correcting the received stored data, generating a request for rewriting the block comprising the corrected received stored data at a second location in another block of the first memory and erasing the block at the first location.

17. The system of claim 16 wherein the correction code is a Hamming code.

18. The system of claim 16 wherein the received commands are arranged to compact data on the first memory device.

19. The system of claim 16 wherein the first memory device is a flash memory.

20. The system of claim 16 wherein the commands to rewrite the block comprise supplying the first memory device with an address to be used for address translation.

* * * * *